US012607519B2

(12) United States Patent　　　　(10) Patent No.:　　US 12,607,519 B2
Despesse et al.　　　　　　　　　　　(45) Date of Patent:　　　Apr. 21, 2026

(54) METHOD AND SYSTEM FOR DETERMINING THE STATE OF A SENSOR THROUGH A SUBSTRATE

(71) Applicant: COMMISSARIAT A L'ENERGIE ATOMIQUE ET AUX ENERGIES ALTERNATIVES, Paris (FR)

(72) Inventors: Ghislain Despesse, Grenoble (FR); Olivier Freychet, Grenoble (FR); Nicolas Garraud, Grenoble (FR); Julien Marianne, Fontaine (FR); Sébastien Boisseau, Grenoble (FR); Tristan Caroff, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 613 days.

(21) Appl. No.: 18/081,568

(22) Filed: Dec. 14, 2022

(65) Prior Publication Data

US 2023/0194354 A1　　Jun. 22, 2023

(30) Foreign Application Priority Data

Dec. 17, 2021　(FR) ...................................... 2113820

(51) Int. Cl.
*G01K 7/01*　　　　(2006.01)
*G01R 23/02*　　　(2006.01)
(52) U.S. Cl.
CPC .............. *G01K 7/01* (2013.01); *G01R 23/02* (2013.01)
(58) Field of Classification Search
CPC . G01K 7/01; G01R 23/02; H04B 5/73; G01N 29/48; G01N 29/50; G01N 29/12; G01N 2291/02863; G01N 2291/2697
See application file for complete search history.

(56) References Cited

U.S. PATENT DOCUMENTS

| | | | |
|---|---|---|---|
| 5,594,705 A | 1/1997 | Connor et al. | |
| 2022/0321237 A1* | 10/2022 | Gebhart | H04B 5/73 |
| 2023/0194354 A1* | 6/2023 | Despesse | G01N 29/50 |
| | | | 374/178 |

FOREIGN PATENT DOCUMENTS

| | | | |
|---|---|---|---|
| EP | 4198507 A1 * | 6/2023 | G01N 29/12 |
| EP | 4575390 A1 * | 6/2025 | G01B 17/04 |

(Continued)

OTHER PUBLICATIONS

Yang, et al., "Through-Metal-Wall Power Delivery and Data Transmission for Enclosed Sensors: A Review", Sensors, vol. 15, No. 12, pp. 31581-31605, 2015.

*Primary Examiner* — Daniel Pihulic
(74) *Attorney, Agent, or Firm* — BakerHostetler

(57)　　　　ABSTRACT

A method for determining the state of at least one sensor, the method using a first electromechanical transducer and a second electromechanical transducer that are coupled to a substrate, and a non-linear electrical circuit connected between the second electromechanical transducer and the sensor, the method comprising the steps of: applying an electrical signal at a first amplitude to the terminals of the first electromechanical transducer, and determining a first set of values of a parameter characteristic of the electrical impedance of the first electromechanical transducer in response to the application of the electrical signal; applying the electrical signal at a second amplitude to the terminals of the first electromechanical transducer, and determining a second set of values of the parameter characteristic of the impedance; measuring a difference between the first set of values and the second set of values; determining a state of the sensor on the basis of the difference between the first set of values and the second set of values.

15 Claims, 11 Drawing Sheets

(56)     References Cited

FOREIGN PATENT DOCUMENTS

FR        3131146  A1  *   6/2023   ............. G01R 23/02
FR        3157536  A1  *   6/2025   ............. G01B 17/04
WO    WO-2021197735  A1  *  10/2021   ............. H04B 11/00

* cited by examiner

METHOD AND SYSTEM FOR DETERMINING THE STATE OF A SENSOR THROUGH A SUBSTRATE

CROSS-REFERENCE TO RELATED APPLICATION

This application claims priority to foreign French patent application No. FR 2113820, filed on Dec. 17, 2021, the disclosure of which is incorporated by reference in its entirety.

FIELD OF THE INVENTION

The invention relates in general to measuring systems, and in particular to a method and a system for determining the state of a sensor through a substrate.

In some fields, measuring systems are used to perform measurements through a conductive substrate or a conductive wall, such as a pipeline, in an environment that is difficult to access, hazardous, corrosive or hostile, and to make this datum accessible. Such measuring systems conventionally use a sensor.

BACKGROUND

However, the environment where the sensor is located may be difficult to access (for example inside a hull of a boat, a block of concrete, a block of metal, pipelines or tanks). In some cases, it may therefore be difficult to use active sensors supplied with power by cells or by batteries, which need to be changed or charged regularly.

It is known to use passive radiofrequency identification (or RFID) devices in which measurements originating from a sensor are stored and retrieved remotely using markers called "radio tags". However, RFID technology does not work when the substrate separating the system interrogating the sensor and the sensor itself is conductive.

Moreover, the dimensions of radio antennas may make them tricky to integrate into the environment. Indeed, the wavelength of an acoustic wave is significantly shorter than a radio wave (by a factor of <1/1000), thereby making it possible to produce interrogation systems that are far more compact. The dimensions of interrogation systems are typically of the order of one wavelength.

In interrogation systems operating with radio waves, the transmission medium (air, vacuum) may be considered to be homogeneous and quasi-infinite, and it interacts only very little with the signal.

By contrast, in interrogation systems operating with acoustic waves, the medium interacts strongly with the signal. Indeed, the propagation speed depends on the materials, the medium not being infinite, and there may be numerous uncontrolled echoes.

One known solution, described in document U.S. Pat. No. 5,594,705, discloses an acoustic transformer for coupling energy through a substrate (for example a hull of a boat). The acoustic transformer comprises a first transducer coupled to the substrate, a second transducer coupled to the substrate, opposite the first transducer, a generator coupled to the first transducer in order to apply an alternating signal, and means for varying the load on the side of the second transducer in order to induce variations in the alternating signal at the terminals of the first transducer.

Such a solution uses load-modulation communication. Indeed, the means for varying the load on the side of the second transducer has to be supplied with power by an electronic circuit, which then interprets sensor information and translates it into a load modulation. Such a device does not contain a battery, but requires an active circuit (modulator) that interrogates a sensor and transforms the measured datum into a modulation signal.

Other passive solutions exist in the RF field. The properties of the sensor are then modified directly by the physical parameter to be measured (sensor antenna).

For example, it is known that a variable resistor may be inserted into the sensor in order to obtain a thermistor the resistance of which varies with temperature, or a strain gauge the resistance of which varies as a function of a deformation/strain.

It is also known to insert a variable capacitor into the sensor in order to obtain a capacitive accelerometer (capacitance dependent on acceleration), a capacitor with properties of the dielectric that depend on temperature/stress, or else a capacitive sensor (proximity sensor, distance measurement, position measurement, presence measurement, liquid fill level measurement).

A resonator may also be inserted into the sensor in order to detect a change in resonant frequency with temperature or mechanical stress, which change the frequency response of the antenna. Such operation is conventionally used in surface acoustic wave (SAW) sensors.

This type of sensor antenna provides substantially the same response seen by the RF interrogator, regardless of the environment, starting from the time when this environment is not electrically conductive.

However, in the field of acoustic interrogators, it is not possible to adopt such an hypothesis. Indeed, the acoustic wave does not propagate in a vacuum and in air because the transmissible energy levels are low in comparison with what is able to be transmitted through solids or liquids.

Therefore, acoustic propagation is highly dependent on the physical materials that are present. The hypotheses of a known, isotropic and quasi-infinite medium are no longer applicable. The signal deformation linked to this channel is no longer able to be predetermined generically, and it is necessary to model each situation in order to deduce therefrom the effect of the channel in each of the cases and thus ascertain a specific change in one of the properties of the acoustic sensor.

There is thus a need for methods and systems for determining the state of a sensor using a passive acoustic interrogation mode and not requiring the propagation channel to be characterized.

SUMMARY OF THE INVENTION

The invention aims to rectify the abovementioned drawbacks by proposing a method that is flexible and easy to use.

One subject of the invention is therefore a method for determining the state of at least one sensor, said method using a first electromechanical transducer and a second electromechanical transducer that are mechanically coupled to a substrate, and an exclusively analogue non-linear electrical circuit electrically connected between the second electromechanical transducer and the sensor, the method comprising the steps of:

applying an electrical signal at a first amplitude to the terminals of the first electromechanical transducer, and determining a first set of values of a parameter characteristic of the electrical impedance of the first electromechanical transducer in response to the application of said electrical signal;

applying said electrical signal at a second amplitude to the terminals of the first electromechanical transducer, and determining a second set of values of the parameter characteristic of the impedance;

measuring a difference between the first set of values and the second set of values; determining a state of the sensor on the basis of the difference between the first set of values and the second set of values.

Advantageously, the sensor comprises a variable-value electronic component, the method comprising the steps of:

determining a first value of a parameter characteristic of the electrical impedance of the first electromechanical transducer, at the first amplitude, determining a second value of a parameter characteristic of the electrical impedance of the first electromechanical transducer, at the second amplitude, the first value and the second value being such that the difference is non-zero, applying the electrical signal at a third amplitude, the third amplitude being between the first amplitude and the second amplitude, and determining a third value of a parameter characteristic of the electrical impedance of the first electromechanical transducer, at the third amplitude, determining the variable value of the variable-value electronic component on the basis of the first value, of the second value and of the third value.

Advantageously, the measurement of a difference between the first set of values and the second set of values is performed within a predefined frequency range, and comprises, within the frequency range, a measurement of a frequency difference between the passages through a predefined impedance modulus value or through a predefined impedance argument value of the first set of values and of the second set of values.

As a variant, the measurement of a difference between the first set of values and the second set of values is performed within a predefined frequency range, and comprises, within the frequency range, a measurement of a frequency difference between the extreme value of the first set of values and the extreme value of the second set of values.

As a variant, the measurement of a difference between the first set of values and the second set of values is performed within a predefined frequency range, and comprises, within the frequency range, a measurement of the phase difference between the first set of values and the second set of values at frequencies corresponding to a predefined value or an extremum of the modulus of the first set of values and to a predefined value or an extremum of the modulus of the second set of values.

As a variant, the measurement of a difference between the first set of values and the second set of values is performed within a predefined frequency range, and comprises, within the frequency range, a measurement of the difference in modulus between the first set of values and the second set of values at frequencies corresponding to a predefined value or a phase extremum of the first set of values and to a predefined value or a phase extremum of the second set of values.

The invention also relates to a system for determining the state of at least one sensor, the system comprising a first electromechanical transducer and a second electromechanical transducer that are mechanically coupled to a substrate, and an exclusively analogue non-linear electrical circuit electrically connected between the second electromechanical transducer and the sensor, the system comprising a sensor state determination unit, the sensor state determination unit being configured to:

apply an electrical signal at a first amplitude to the terminals of the first electromechanical transducer, and determine a first set of values of a parameter characteristic of the electrical impedance of the first electromechanical transducer in response to the application of said electrical signal;

apply said electrical signal at a second amplitude to the terminals of the first electromechanical transducer, and determine a second set of values of the parameter characteristic of the impedance;

measure a difference between the first set of values and the second set of values;

determine a state of the sensor on the basis of the difference between the first set of values and the second set of values.

Advantageously, the non-linear electrical circuit comprises two diodes in parallel and reverse-biased with respect to one another, the diodes being configured to be connected in parallel with the sensor.

As a variant, the non-linear electrical circuit comprises two Zener diodes that are connected head-to-tail in series, the Zener diodes being configured to be connected in series with the sensor.

As a variant, the non-linear electrical circuit comprises a first branch and a second branch that are connected in parallel, the first branch comprising two Zener diodes that are connected head-to-tail in series, the second branch comprising two diodes that are connected in parallel, reverse-biased with respect to one another and configured to be connected in series with the sensor.

As a variant, the non-linear electrical circuit comprises a first current limiter and a second current limiter that are connected in series, the first current limiter moreover being configured to be connected in parallel with the sensor, the value of the short-circuit current of the first current limiter being less than the value of the short-circuit current of the second current limiter.

As a variant, the non-linear electrical circuit comprises a first branch, a second branch and a third branch that are connected in parallel, the first branch comprising two Zener diodes that are connected head-to-tail in series, the second branch comprising two diodes that are connected in parallel and reverse-biased with respect to one another, and configured to be connected in series with a first sensor, the third branch comprising two Zener diodes that are connected head-to-tail in series, the Zener diodes of the third branch being configured to be connected in series with a second sensor.

As a variant, the non-linear electrical circuit comprises a first branch and a second branch, the first branch comprising two diodes that are connected in parallel and reverse-biased with respect to one another, and configured to be connected in parallel with a first sensor, the second branch comprising two diodes that are connected in parallel and reverse-biased with respect to one another, the first and the second branch being configured to be connected in series with a second sensor.

As a variant, the non-linear electrical circuit comprises a rectifier bridge connected to the terminals of the second electromechanical transducer, and a transistor controlled by the voltage across the terminals of the sensor, the sensor state determination unit being configured to determine a state of the sensor on the basis of the turn-on voltage of the transistor.

Advantageously, the first electromechanical transducer and the second electromechanical transducer each comprise a piezoelectric component.

BRIEF DESCRIPTION OF THE DRAWINGS

Other features, details and advantages of the invention will become apparent on reading the description given with reference to the appended drawings, which are given by way of example.

FIG. 1 illustrates the configuration in which the method may be applied. A first electromechanical transducer 2 and a second electromechanical transducer 3 are positioned on either side of a substrate 4. Other configurations are conceivable, for example, the second electromechanical transducer 3 is positioned on the same side of the substrate as the first electromechanical transducer 2, but in an inaccessible location. The substrate is a rigid mechanical component in which a vibration wave generated by one of the electromechanical transducers is able to propagate.

The first electromechanical transducer 2 and the second electromechanical transducer 3 are coupled mechanically to the substrate 4, that is to say in physical contact with the substrate 4, such that the propagation of the vibration wave between the transducers is optimum. It is thus necessary for at least one acoustic mode to be able to propagate between the first electromechanical transducer 2 and the second electromechanical transducer 3. The transducers may for example be fastened by adhesive bonding to the substrate 4, or for example via fastening lugs, or kept in contact by the magnetic force of a magnet, or else, on the side of the first electromechanical transducer 2, kept in contact by pressure exerted by the user.

Figure 1:
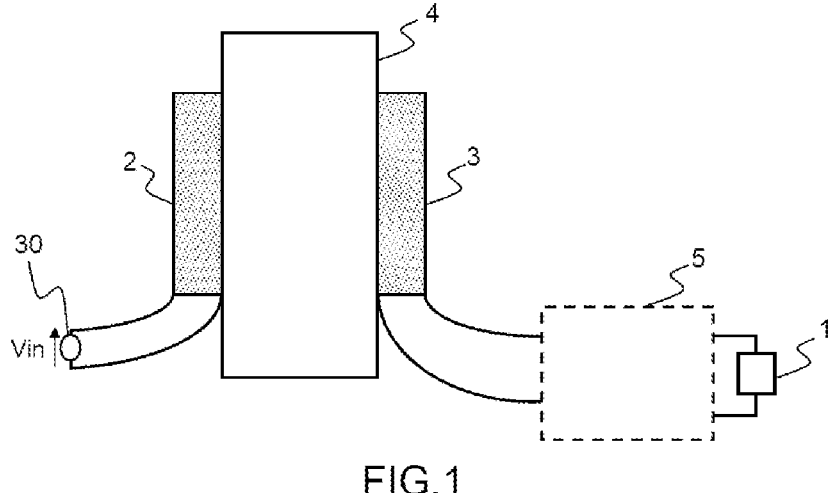
FIG. 1 is a diagram showing a system according to the invention.

In FIG. 1, the substrate has dimensions close to those of the electromechanical transducers, but the invention may be applied to substrates with variable lengths, ranging for example from a small mechanical component such as an engine component to a very large component such as a pipeline. Likewise, it is not necessary for the electromechanical transducers to be of the same type. If both electromechanical transducers are piezoelectric transducers, their dimensions may be identical. As a variant, one of the electromechanical transducers may be a piezoelectric transducer, and the other electromechanical transducer may be of a different kind (for example a coil and a magnet).

In the case of a pipeline component, it is understood that the second electromechanical transducer 3 is positioned inside the pipeline at a location that is difficult to access. The second electromechanical transducer 3 may also be positioned externally at a remote location that is difficult to access (inside a borehole, in a tank containing a liquid, or else in a penstock that may be on a steep wall that is difficult to access, for example on a mountain). In this case, it may be beneficial to be able to interrogate remote sensors from points where the pipe is easily accessible.

The first electromechanical transducer 2 and the second electromechanical transducer 3 are preferably positioned so as to face one another through the substrate 4 in order to optimize the transmission of power between the two electromechanical transducers.

The invention is particularly applicable to metal substrates 4 for which RFID interrogation is unreliable. However, the invention may be extended to any type of substrate 4, without any limit on the material.

Electromechanical transducers are designed to receive energy from an electrical system and to supply energy to a mechanical system, or vice versa. The electromechanical transducers may advantageously be electroacoustic transducers, and more particularly piezoelectric transducers. Piezoelectric transducers comprise an electro-active material that induces a voltage when a pressure or a stress is applied thereto, and vice versa. Other electromechanical transducers may be contemplated, for example electret-based electrostatic transducers, or electromagnetic transducers.

An exclusively analogue non-linear circuit is connected between the second electromechanical transducer 3 and the sensor 1. A non-linear circuit is understood to mean a load the behaviour of which is fundamentally different depending on the value of a parameter (for example the amplitude of the voltage or the current) applied to the terminals of the circuit. "Exclusively analogue" is understood to mean a passive circuit, or a circuit comprising transistors in linear regime (the non-linear nature of the circuit is different from the linear regime of a transistor). The non-linear circuit thus does not comprise any computer and is not controlled by a digital control circuit. Due to its exclusively analogue nature, the non-linear circuit does not perform any analysis or measurement of the state of the sensor, and does not perform any modulation on the basis of the state of the sensor.

The idea on which the invention is based is that of being able to measure the state of a sensor remotely via a differential electrical impedance measurement performed on an electromechanical transducer, based on at least two impedance measurements at two different amplitudes.

It is recalled that electrical impedance measures the opposition of an electrical circuit to the flow of a sinusoidal AC current.

A sensor state determination unit 30, comprising a voltage source, or a current source, is electrically connected to the first electromechanical transducer 2, so as to impose, respectively, a sinusoidal voltage at a predefined maximum amplitude, or a sinusoidal current at a predefined maximum amplitude, on the other elements of the system.

The impedance measurement may be performed by an impedance-measuring device, also called an impedance meter, which may be integrated into the sensor state determination unit 30. According to one variant, the impedance measurement may be performed in a computing device separate from the voltage source or current source, for example in a computer.

The electrical impedance of the first electromechanical transducer 2 therefore corresponds to that which is "seen" by the determination unit 30.

For the various embodiments described below, it is possible to impose a voltage Vin using a voltage source, and to measure the current $I_{in}$ in order to determine the impedance. It is also possible to impose a current $I_{in}$ using a current source, and to measure the voltage Vin in order to determine the impedance. The concept of amplitude of the measurement may be applied both to $I_{in}$ and to Vin.

Figure 2:
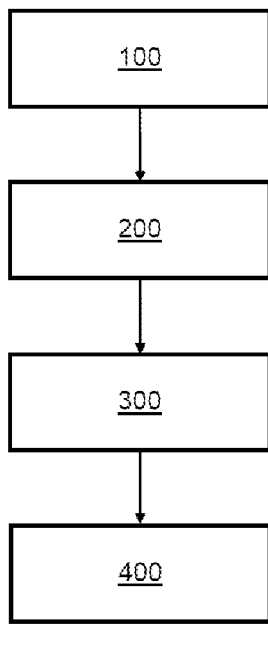
FIG. 2 is a flowchart showing a method according to the invention.

The method comprises, in a first step 100 (FIG. 2), applying an electrical signal at a first amplitude to the terminals of the first electromechanical transducer 2, and determining a first set of values of a parameter characteristic of the impedance of the first electromechanical transducer 2 in response to the application of said electrical signal.

The frequency band of the electrical signal is preferably located around the frequency of a resonance mode of the first electromechanical transducer 2 and/or of a resonance mode of the second electromechanical transducer 3.

In a second step 200 (FIG. 2), the electrical signal is applied at a second amplitude, and a second set of values of the parameter characteristic of the impedance is determined.

The information linked to the state of the sensor 1 is coded in the non-linearity of the impedance of the second electromechanical transducer 3 associated with the non-linear electrical circuit 5 on the basis of the amplitude of the measurement signal imposed by the voltage source or current source.

It is the behaviour of the second electromechanical transducer 3, set in motion via the substrate 4, which, in response to this setting in motion, exhibits non-linear mechanical feedback with respect to the amplitude.

The propagation channel is considered to be linear with the amplitude of the transmitted signal, in contrast to the second electromechanical transducer 3 associated with the non-linear electrical circuit 5 and with the sensor 1, thereby making it possible to discriminate the non-linear properties of the second electromechanical transducer 3 associated with the non-linear electrical circuit 5 and with the sensor 1 with respect to the channel.

In a third step 300 of the method (FIG. 2), a difference between the first set of values and the second set of values is measured, in accordance with one of the proximity criteria defined below. The difference corresponds to a difference between two sets of values, in accordance with a predefined criterion.

Thus, by selecting the first and the second amplitude appropriately, the state of the sensor 1 is able to be determined on the basis of the difference between the first set of values and the second set of values (fourth step 400).

The method may be repeated periodically in order to evaluate the state of the sensor 1 regularly. As an alternative or in addition, it may be implemented on a one-off basis, for example in the event of an aberrant measurement from the sensor 1.

Figure 3:
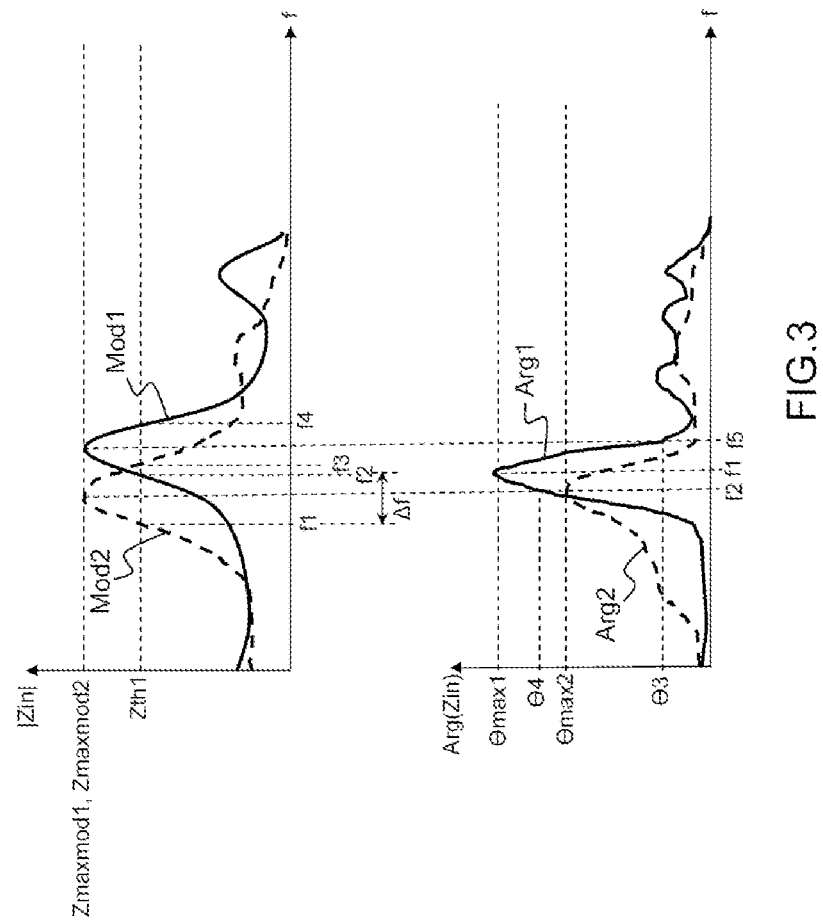
FIG. 3 is a graph showing an evolution of the modulus and of the argument of the impedance seen by the first transducer, for two amplitudes of the electrical signal.

FIG. 3 illustrates two measurements for characterizing the impedance, specifically the modulus (upper part of FIG. 3) and the argument (lower part of FIG. 3). The modulus corresponds to the ratio between the amplitude of the voltage and the amplitude of the current, and the argument corresponds to the difference between the phase value of the voltage and the phase value of the current.

The curve Mod1 corresponds to a plurality of measurements of the modulus of the impedance seen by the first electromechanical transducer 2, for various frequencies of the signal, at a first amplitude. For a sinusoidal signal, or more generally for an alternating signal, the amplitude corresponds to the peak value of the signal, that is to say the maximum value. The curve Mod2 corresponds to a plurality of measurements of the modulus of the impedance seen by the first electromechanical transducer 2, for various frequencies of the signal, at a second amplitude, different from the first amplitude.

It is possible, for example, to perform the measurements for a finite set of frequencies, and then to perform an interpolation operation, in order to obtain a continuous set of values, over a predetermined frequency range.

The measurement frequency range is predefined, and may be for example determined on the basis of the properties of the first electromechanical transducer 2 and/or of the second electromechanical transducer 3.

The curve Arg1 corresponds to a plurality of measurements of the argument of the impedance seen by the first electromechanical transducer 2, for various frequencies of the signal, at the first amplitude. The curve Arg2 corresponds to a plurality of measurements of the argument of the impedance seen by the first electromechanical transducer 2, for various frequencies of the signal, at the second amplitude.

It is not necessary to measure both the modulus and the argument to implement the method according to the invention. One of the two measurements may suffice, this depends on the definition of the difference, as defined below.

According to a first embodiment, the measurement of the difference between the first set of values and the second set of values comprises the measurement of a frequency difference between the passages through a predefined impedance modulus value or through a predefined impedance argument value of the first set of values and of the second set of values.

The upper part of FIG. 3 illustrates the abovementioned embodiment, with a predefined impedance modulus value Zth1. The set of values Mod1 at the first amplitude reaches the value Zth1 for the frequencies f2 and f4. The set of values Mod2 at the second amplitude reaches the value Zth1 for the frequencies f1 and f3.

In one embodiment, only frequencies corresponding to the first crossing of the threshold Zth1 are considered. Thus, according to this embodiment, the difference between the first set of values Mod1 and the second set of values Mod2 corresponds to the difference $\Delta f=f2-f1$.

According to another embodiment for calculating the difference between the sets of values, the difference may be defined, within a predefined frequency range, by the frequency difference between the extreme value of the first set of values and the extreme value of the second set of values.

The extreme value preferably corresponds to the maximum of each set of values. In the lower part of FIG. 3, the first set of values of the argument Arg1 at the first amplitude has a maximum value Bmax1, at a frequency f1, and the second set of values of the argument Arg2 at the second amplitude has a maximum value Bmax2, at a frequency f2. According to this embodiment, the difference corresponds to the difference $\Delta f=f1-f2$.

According to another embodiment illustrated by the lower part of FIG. 3, the difference may be calculated by measuring, in the predefined frequency range, the difference in modulus or argument between the extremum of the first set of values and the extremum of the second set of values. The extremum preferably corresponds to the maximum value.

In the example of FIG. 3 (lower part), the difference may be obtained using the calculation $\Delta\theta=Bmax1-Bmax2$.

According to another embodiment, the difference corresponds to a difference in argument between the first set of values and the second set of values at frequencies corresponding to an extremum (or to a predefined value) of the modulus of the first set of values and to the extremum (or to a predefined value) of the modulus of the second set of values. The extremum preferably corresponds to the maximum of each set of values.

For example, in the upper part of FIG. 3, the first set of values Mod1 of the modulus at a first amplitude, and the second set of values Mod2 of the modulus at a second amplitude, each have a maximum value, respectively Zmaxmod1 and Zmaxmod2, which are the same in FIG. 3.

The value Zmaxmod1 is reached at the frequency f5, and the value Zmaxmod2 is reached at the frequency f2. Assuming that the graph in the upper part and the one in the lower part are able to be aligned, the value of the argument of the first set of values Arg1 at the frequency f5 is θ3, and the value of the argument of the second set of values Arg2 at the frequency f2 is θ4. According to this embodiment, the difference corresponds to the difference Δθ=θ4−θ3.

The same measurement principle may be applied reciprocally by calculating a measurement of the difference in modulus between the first set of values and the second set of values at frequencies corresponding to an argument extremum (in particular the maximum) of the first set of values (or to a predefined value) and to an argument extremum (in particular the maximum) of the second set of values (or to a predefined value).

According to another embodiment, the difference is calculated based on an intercorrelation between the two sets of measurements.

Calculating the difference between the set of values at the first amplitude and the set of values at the second aptitude, in accordance with one of the abovementioned embodiments, makes it possible to determine whether the parameter characteristic of the impedance (modulus or argument) of the first electromechanical transducer 2, seen by the sensor state determination unit 30, in response to the application of said electrical signal, varies or by contrast remains substantially constant, depending on whether the signal is applied with the first or with the second amplitude.

Figure 4:
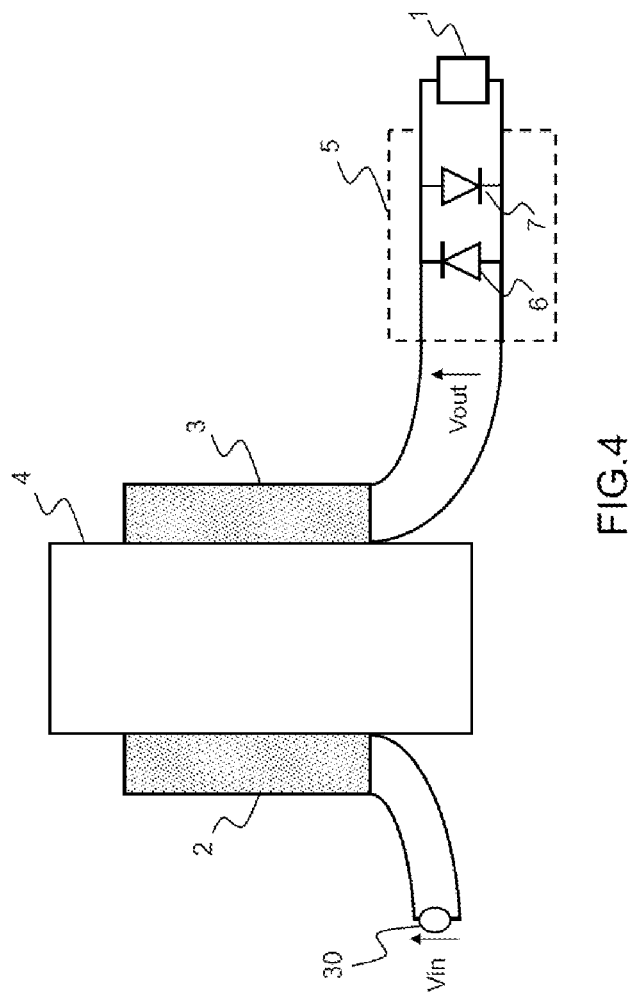
FIG. 4 illustrates a first embodiment of the system according to the invention.

FIG. 4 illustrates one embodiment of the system for determining the state of at least one sensor according to the invention. The non-linear electrical circuit 5 comprises a first diode 6 and a second diode 7 that are connected in parallel and reverse-biased with respect to one another. The diodes are connected in parallel with the sensor 1.

For an "all-or-nothing" sensor 1, such as a stop sensor or end position sensor, the system makes it possible to determine whether the contact of the sensor is open (open circuit) or closed (short circuit).

The information relating to the open or closed state may be determined by applying the electrical signal at two different amplitudes, as described above.

If the sensor 1 is short-circuited, the impedance seen by the first electromechanical transducer 2 is identical, or substantially identical, regardless of the amplitude of the electrical signal. Thus, if it is determined that the difference between the first set of values and the second set of values is zero, it may be concluded that the sensor 1 is short-circuited.

A tolerance margin may be applied to the determination of the difference between the first set of values and the second set of values. The tolerance margin may be for example a predetermined value, or a fraction of the predefined frequency range, or of the difference between the maximum and minimum values of the modulus or of the argument of the impedance.

If the sensor 1 is open-circuited, the electrical impedance seen by the second transducer 3 is very large when the voltage Vout (voltage across the terminals of the non-linear circuit 5) is less than the threshold voltage of the diodes (typically less than 0.6 V, this value depending on the technology of the diode). The impedance is low when the voltage Vout tends to be much greater than the threshold voltage of the diodes, that is to say the amplitude of the open-circuit voltage would be much higher than the amplitude of the RMS voltage in the presence of the diodes.

This variation in electrical impedance, connected in the second electromechanical transducer 3, with the amplitude creates a measurable difference between the impedance measured at the first amplitude and the impedance measured at the second amplitude in terms of the electrical impedance of the first electromechanical transducer 2.

This embodiment advantageously makes it possible to detect opening of the sensor 1 while the sensor is in a naturally closed state. The occurrence of a difference between the first set of values and the second set of values specifically characterizes the opening of the sensor 1.

The amplitudes are predetermined such that, for one of the amplitudes, the open-circuit voltage Vout is less than the threshold voltage of the diodes, and that, for the other amplitude, the open-circuit voltage Vout is greater than the threshold voltage of the diodes.

It is for example possible to define the amplitudes to be applied to the electrical signal by way of empirical measurements carried out in a calibration phase of the method, or by way of propagation channel simulation.

Figure 5:
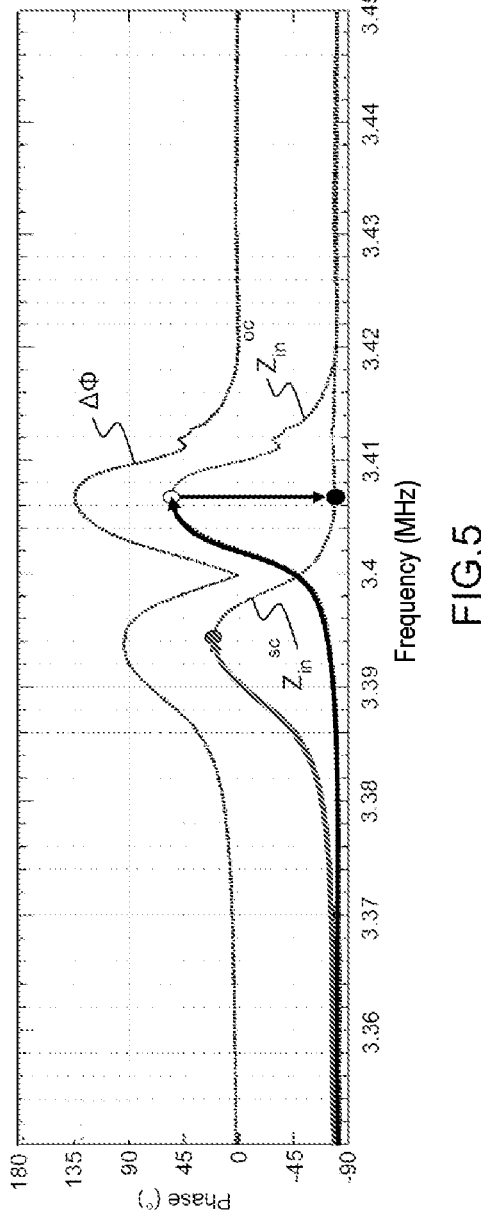
FIG. 5 is a graph showing an evolution of the argument of the impedance seen by the first transducer, for two amplitudes of the electrical signal, with the system according to the first embodiment.

FIG. 5 illustrates the principle of detecting the open or closed state of a sensor, with the system according to the embodiment of FIG. 4.

If the sensor 1 is short-circuited, the set of values of the argument of the impedance corresponds to the curve $Z_{in}^{sc}$. The set of values is identical regardless of the amplitude of the electrical signal.

If the sensor 1 is open-circuited, and if the electrical signal has a high amplitude (such that open-circuit Vout>>Vthd, where Vthd corresponds to the threshold voltage of the diodes 6 and 7), the amplitude of Vout is clipped by the diode 7 on the positive half-cycle and the diode 6 on the negative half-cycle, the set of values thus corresponds substantially to the set of values of the argument of the impedance $Z_{in}^{sc}$ when the sensor 1 is short-circuited.

If the sensor 1 is open-circuited, and if the electrical signal has a low amplitude (such that open-circuit Vout<Vthd), the diodes 6 and 7 are blocked. The curve $Z_{in}^{sc}$ represents the corresponding set of values, which is distinct from the set of values of the argument of the impedance $Z_{in}^{sc}$ when the sensor 1 is short-circuited.

The curve ΔΦ corresponds to the difference between the phase curves of $Z_{in}^{sc}$ and of $Z_{in}^{sc}$. The maximum of the curve ΔΦ is located at a frequency of the electrical signal equal to 3.406 MHz. The difference between the two sets of values at this frequency is around 135°.

Having such a difference between the two sets of values makes it possible to determine the state of the sensor.

Figure 6:
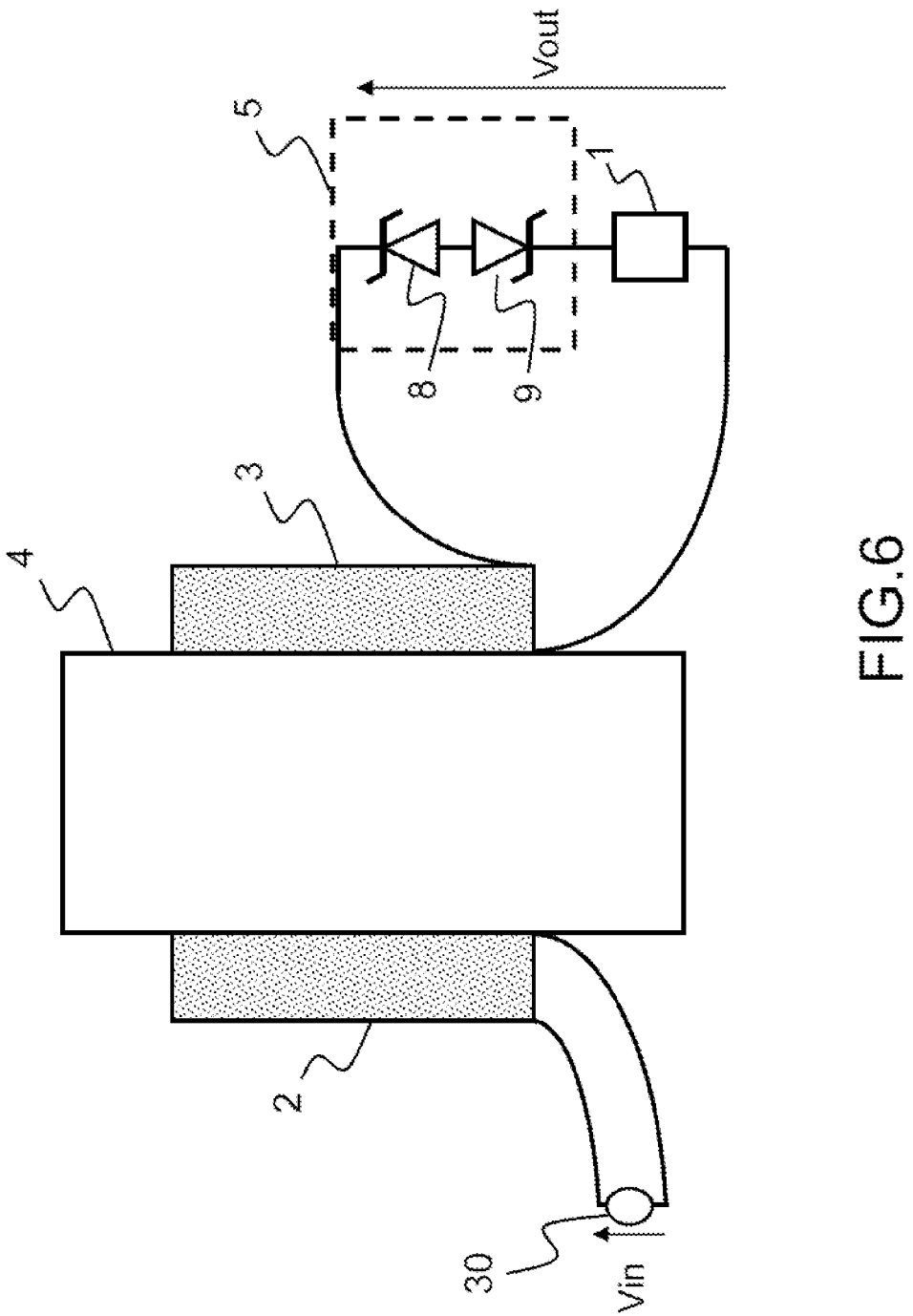
FIGS. 6, 7 and 9 to 12 illustrate other embodiments of the system according to the invention.

According to another embodiment of the system, illustrated by FIG. 6, the non-linear electrical circuit 5 comprises two Zener diodes (8, 9) that are connected head-to-tail in series, that is to say the anodes of which are connected directly to one another. The Zener diodes (8, 9) are also connected in series with the sensor 1. It is possible to choose the type of Zener diode on the basis of the desired Zener voltages.

If the sensor 1 is open-circuited, there is little or no variation in impedance on the basis of the amplitude of the electrical signal. If the sensor 1 is short-circuited, with a low-amplitude electrical signal, the electrical impedance seen by the first electromechanical transducer 2 is different from that seen with a high-amplitude electrical signal.

The low amplitude and the high amplitude are predetermined on the basis of the Zener voltages of the diode 8 and of the diode 9 and of their threshold voltage.

This embodiment advantageously makes it possible to detect closing of the sensor 1 while the sensor is in a naturally open state. The occurrence of a difference between the first set of values and the second set of values specifically characterizes the closing of the sensor 1.

Figure 7:
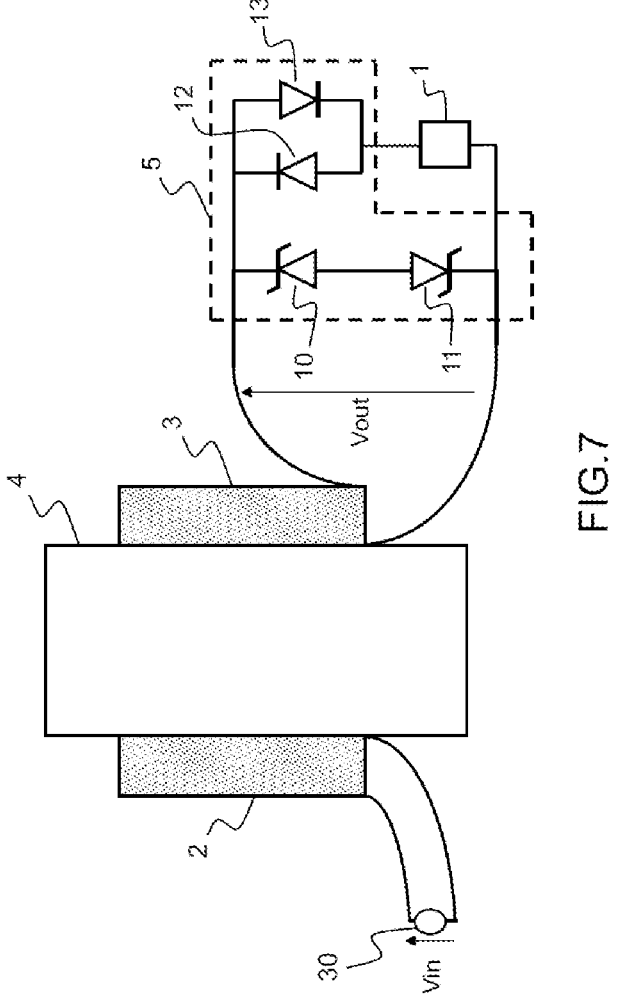

According to another embodiment, illustrated by FIG. 7, the non-linear electrical circuit 5 comprises a first branch and a second branch that are connected in parallel with the terminals of the second electromechanical transducer 3. The first branch comprises two Zener diodes (10, 11) that are connected head-to-tail in series, that is to say connected by their respective anode.

The second branch comprises two diodes (12, 13) that are connected in parallel and reverse-biased with respect to one another. The set of the two diodes (12, 13) connected in parallel is connected in series with the sensor 1.

This embodiment advantageously makes it possible to easily determine the impedance of the sensor 1, and not just its open or closed state. This is particularly advantageous for linear-response sensors, comprising a variable resistor or a variable capacitor.

Indeed, at very low amplitude, such that the voltage Vout is less than the threshold voltage of the diodes 12 and 13, the diodes 12 and 13, along with the Zener diodes 10 and 11, are blocked, and the non-linear circuit 5 is likened to an open circuit. A first set of values of a parameter characteristic of the impedance seen by the first electromechanical transducer may thus be determined (impedance Zin1).

It is also possible to measure an impedance Zin2 for an amplitude such that Vout is greater than the threshold voltage of the diodes 12 and 13, but less than the Zener voltage of the Zener diodes 10 and 11 (for example 6 V). This is thus tantamount to measuring an equivalent of a non-linear circuit formed by the diodes 12 and 13 and by the sensor 1.

Moreover, at very high amplitude, such that the open-circuit voltage Vout is greater than the Zener voltage of the Zener diodes 10 and 11 (for example twice as great), the Zener diodes 10 and 11 are conducting, and the non-linear circuit 5 is likened to a short circuit. A third set of values of a parameter characteristic of the impedance seen by the first electromechanical transducer may thus be determined (impedance Zin3).

By "positioning" the impedance Zin2 with respect to Zin1 (open circuit) and Zin3 (short circuit), notably with regard to the associated characteristic parameter (variable resistance or variable capacitance), it is possible to find/position the intermediate value corresponding to the impedance of the physical sensor, while at the same time doing away with the effects of the channel.

A measurement Mes of the impedance of the sensor may for example be deduced through relative ratios, using the following formula:

$$Mes = \alpha \cdot \Delta(Zin2 - Zin1)/\Delta(Zin3 - Zin1) + 3 \qquad (1)$$

Where A represents the difference on the parameter characteristic of the impedance, and a and p are predetermined parameters specific to the sensor 1. The difference may be measured in accordance with one of the embodiments described above.

It is possible to perform as many impedance Zin measurements at as many amplitudes as desired, for example in order to confirm a measurement, but also to adopt a position with respect to the thresholds of the one or more non-linearities:

It is for example possible to start from a very low measurement amplitude and to gradually increase it until obtaining an impedance change and thus detecting a first non-linearity.

Within the scope of the abovementioned embodiment for determining the impedance of the sensor, it is possible to continue this progression in order to detect a second non-linearity, and so on in order to detect all non-linearities and thus find out what amplitude to apply in order to carry out the one or more correct differential measurements in order to recover the information from the physical sensor.

Figure 8:
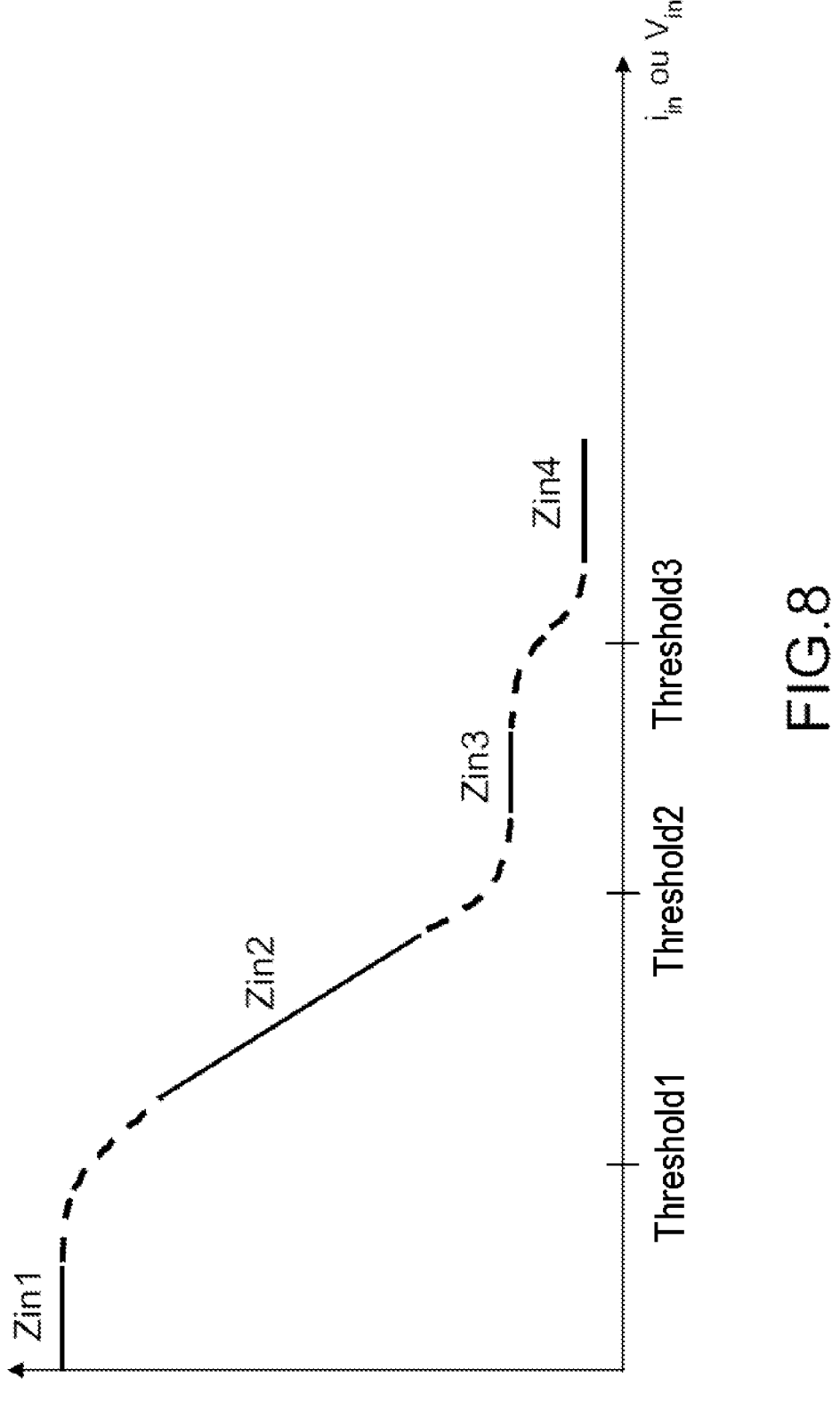
FIG. 8 is a graph showing the evolution of the impedance seen by the first transducer, for various amplitude values of the electrical signal.

FIG. 8 thus illustrates one example of the evolution of the impedance with amplitude, it being understood that this is a symbolic representation of the impedance, which has a real component (the modulus) and an imaginary component (the argument).

The portions in unbroken lines (Zin1, Zin2, Zin3, Zin4) represent tangential trends of the impedance of the assembly formed by the sensor 1 and the non-linear circuit 5. When a tangential trend is inclined, this means that it has at least one component that depends on the amplitude of the electrical signal at the terminals of the first transducer 2 (current $i_{in}$ or voltage $V_{in}$). When it is horizontal, it is substantially constant within the amplitude range under consideration.

The portions in dashed lines represent the junctions between the tangential trends of the impedance of the assembly formed by the sensor 1 and the non-linear circuit 5. It is thus possible to determine impedance change thresholds (Threshold1, Threshold2, Threshold3).

The information to be measured may be deduced from the impedance values Zin in the tangential areas or else from the value of the impedance change thresholds Threshold1, Threshold2, etc.

In order to do away with the effects of the channel, the principle therefore consists in performing a relative identification (Threshold2, Threshold3 with respect to Threshold1), in a manner similar to equation (1).

A measurement Mes of the impedance of the sensor, as a variant to equation (1), may thus be deduced through relative ratios of the thresholds between the tangential areas, using the following formula:

$$Mes = \alpha \cdot (Threshold2 - Threshold1)/(Threshold3 - Threshold1) + 3 \qquad (2)$$

Determining the state of the sensor may thus be extended to determining the impedance of the sensor, in one embodiment in which the sensor is not an all-or-nothing sensor but a linear sensor, that is to say a sensor comprising a variable-value electronic component. According to one embodiment, the variable-value electronic component may be a variable resistor, a variable capacitor, a variable inductor or else have a variable resonant frequency.

The embodiments described in connection with FIGS. 4, 6 and 7, in which the non-linear circuits 5 comprise diodes, make it possible to detect non-linearities linked to a voltage amplitude. Implementing non-linearities linked to a voltage amplitude is relatively simple, using purely passive components such as diodes.

Figure 9:
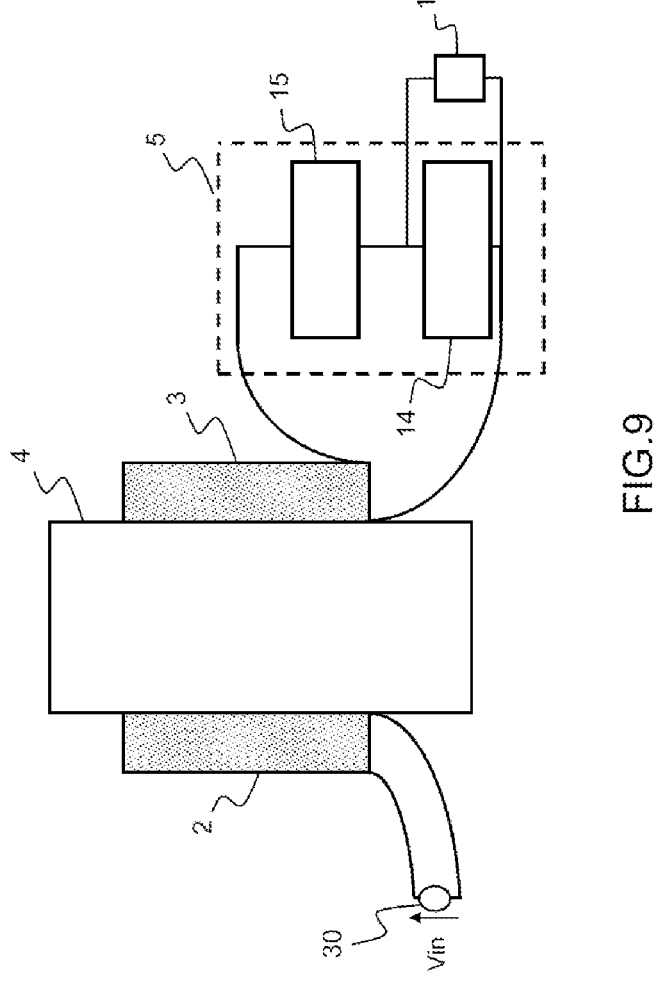

It is also possible, according to one embodiment illustrated by FIG. 9, to determine the impedance of the sensor by detecting non-linearities linked to a current amplitude.

The non-linear electrical circuit 5 comprises a first current limiter 14 and a second current limiter 15 that are connected in series. The first current limiter 14 may be connected in parallel with the sensor 1.

Each current limiter is a current regulator, that is to say a circuit acting as a short circuit for as long as the current flowing through it is less than a predetermined value, and which supplies a regulated and constant current if the input current is greater than or equal to the predetermined value. Each current limiter may be produced for example in the form of an integrated circuit, biased by a current source and using current mirrors.

If the current flowing through the non-linear circuit 5 is less than the value of the short-circuit current (threshold current) of the first current limiter 14 and of the second current limiter 15, the current limiters act as a short circuit. A first set of values of a parameter characteristic of the impedance seen by the first electromechanical transducer may thus be determined (impedance Zin1).

It is also possible to measure an impedance Zin2 for an amplitude such that the current flowing through the non-linear circuit 5 is greater than the short-circuit current of the first current limiter 14 and less than the short-circuit current of the second current limiter 15. The second current limiter 15 is short-circuited, and the first current limiter 14 is likened to an open circuit. A portion of the current flows through the sensor 1, thereby making it possible to measure an impedance Zin2.

At very high amplitude, such that the current flowing through the non-linear circuit 5 is greater than the threshold of the first current limiter 14 and of the second current limiter 15, the second current limiter 15 is likened to an open circuit, thereby making it possible to measure an impedance Zin3.

The impedance of the sensor 1 may then be determined through relative ratios, as indicated in equation (1) in connection with the embodiment illustrated by FIG. 7.

Figure 10:
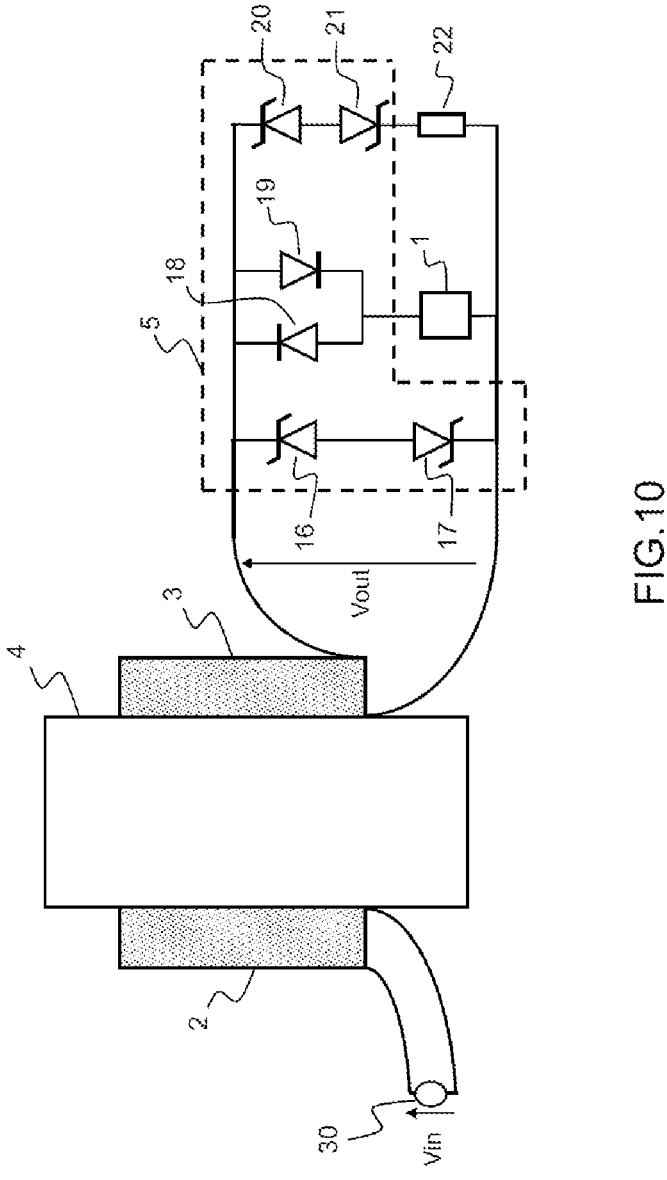

The embodiment illustrated by FIG. 10 makes it possible to determine the state of a first sensor 1 and of a second sensor 22.

The non-linear circuit 5 comprises a first branch, a second branch and a third branch that are connected in parallel. The first branch comprises two Zener diodes (16, 17) that are connected head-to-tail in series, that is to say connected to one another by their anode.

The second branch comprises two diodes (18, 19) that are connected in parallel and reverse-biased. The anode of the first diode 18 and the cathode of the second diode 19 are connected to the first sensor 1.

The third branch comprises two Zener diodes (20, 21) that are connected head-to-tail in series. The cathode of one of the two Zener diodes (20, 21) is connected in series with a second sensor 22.

The Zener voltage of the Zener diodes (16, 17) of the first branch is preferably greater than the Zener voltage of the Zener diodes (20, 21) of the third branch, so as to make them conduct for different amplitudes.

At very low amplitude, such that the voltage Vout across the terminals of the non-linear circuit 5 is less than a first threshold voltage Vth1 corresponding to the threshold voltage of the diodes 18 and 19 arranged in series with the first sensor, all of the diodes of the circuit are blocked, and the non-linear circuit 5 forms an open circuit. A first impedance Zin1 is measured.

By increasing the amplitude such that the voltage Vout across the terminals of the non-linear circuit 5 is between the first threshold voltage Vth1 and a second threshold voltage Vth2 corresponding to the Zener voltage of the Zener diodes (20, 21) of the third branch, an impedance Zin2 is measured. In this configuration, only the diodes 18 and 19 are conducting, and the impedance Zin2 thus makes it possible to calculate an impedance of the first sensor 1, in accordance with the procedure described above. Specifically, in this case, the configuration is identical to the one illustrated by FIG. 7.

It is also possible to determine the open or closed state of the first sensor 1 on the basis of the measured difference between the set of values of the parameter characteristic of the first impedance Zin1 and the set of values of the parameter characteristic of the second impedance Zin2.

By further increasing the amplitude of the electrical signal such that the voltage Vout across the terminals of the non-linear circuit 5 is between the second threshold voltage Vth2 and a third threshold voltage Vth3 corresponding to the Zener voltage of the Zener diodes (16, 17) of the first branch, the Zener diodes (20, 21) of the third branch become conducting.

It is then possible to measure an impedance Zin3 and, knowing the impedance of the first sensor 1 calculated in the previous step, it is possible to determine the impedance of the second sensor 22.

It is also possible to determine the open or closed state of the second sensor 22 on the basis of the measured difference between the set of values of the parameter characteristic of the second impedance Zin2 and the set of values of the parameter characteristic of the third impedance Zin3, by also knowing the open or closed state of the first sensor 1 as determined previously.

By further increasing the amplitude such that the open-circuit voltage Vout across the terminals of the non-linear circuit 5 is greater than the third threshold voltage Vth3, the Zener diodes 16 and 17 become conducting, thereby creating substantially a short circuit. An impedance Zin4 is also measured.

"Substantially short-circuited" is understood to mean a state in which the voltage Vout is limited to an amplitude significantly lower than the open-circuit voltage Vout, for example by a factor of at least two, advantageously by a factor of at least three.

The impedance of the first sensor 1 and of the second sensor 22 may then be determined through relative ratios, as indicated in equation (1) in connection with FIG. 8.

Figure 11:
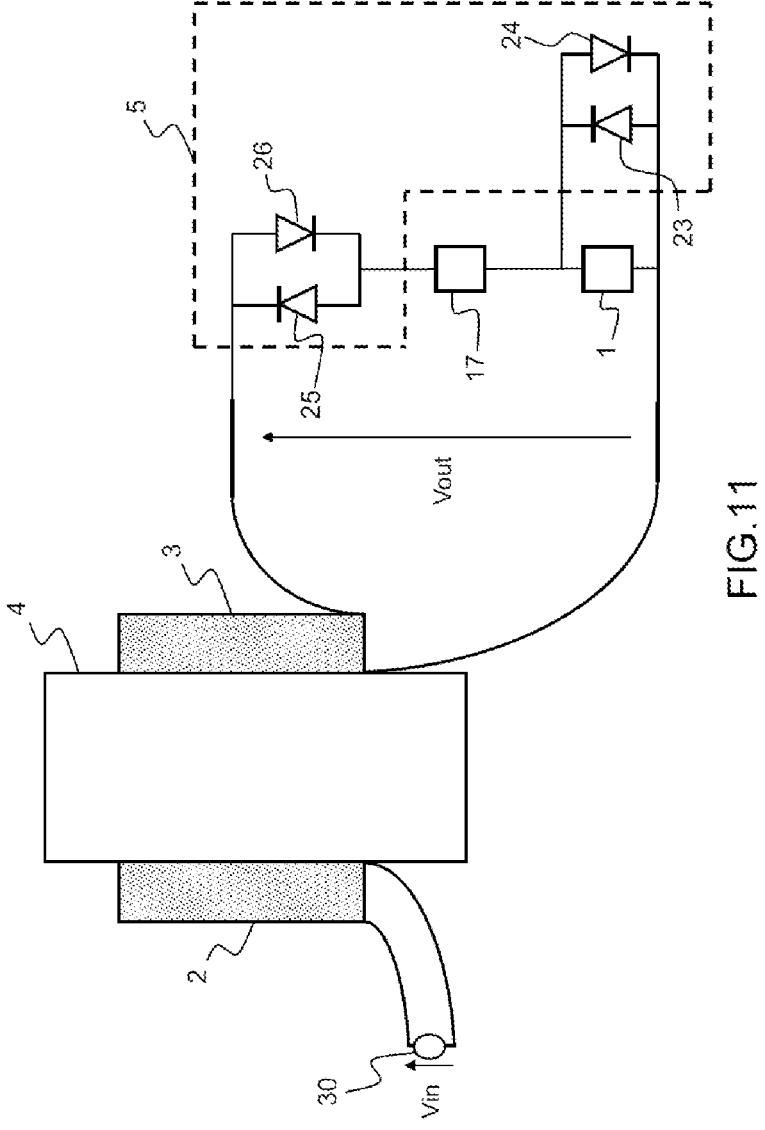

FIG. 11 illustrates an embodiment that makes it possible to determine the open or closed state of two sensors, or else the impedance thereof if a linear-response sensor is involved, as a variant to the embodiment illustrated by FIG. 10.

The non-linear electrical circuit 5 comprises a first branch and a second branch. The first branch comprises two diodes (23, 24) that are connected in parallel and reverse-biased with respect to one another, and are connected in parallel with a first sensor 1.

The second branch comprises two diodes (25, 26) that are connected in parallel and reverse-biased with respect to one another, and are connected in series with a second sensor 22. The first sensor 1 and the second sensor 22 are connected in series.

All of the diodes of the non-linear electrical circuit 5 have the same threshold voltage.

A first impedance Zin1 seen by the first transducer 2 is measured at an amplitude such that the voltage Vout across the terminals of the non-linear electrical circuit 5 is less than a first threshold voltage Vth1 that corresponds to the threshold voltage of the diodes 25 and 26 of the second branch.

The diodes 25 and 26 are blocked, and the impedance of an equivalent open circuit is thus measured.

A second impedance Zin2 seen by the first transducer 2 is measured at an amplitude such that the voltage Vout is between the first threshold voltage Vth1 and a second threshold voltage Vth2 that corresponds to the sum of the threshold voltage of the diodes of the first branch and the threshold voltage of the diodes of the second branch. At this amplitude, an equivalent of the two sensors 1 and 22 placed in series may be determined.

A third impedance Zin3 seen by the first transducer 2 is measured at an amplitude such that the voltage Vout is greater than the second threshold voltage Vth2. At this amplitude, the first sensor 1 is substantially short-circuited, and the diodes 25 and 26 of the second branch are conducting and clip the amplitude of the voltage seen by the first sensor 1. An equivalent of the second sensor 22 may thus be determined.

The information regarding the first sensor 1 is then deduced from the knowledge of the impedance linked to the sum of the two sensors and to the impedance linked to the sensor 22 on its own.

The impedance of the first sensor 1 and of the second sensor 22 may be determined through relative ratios, as indicated in equation (1) in connection with FIG. 8.

This embodiment is particularly advantageous since it is possible to determine the state of the first sensor 1 even when the second sensor 22 is accidentally short-circuited.

Figure 12:
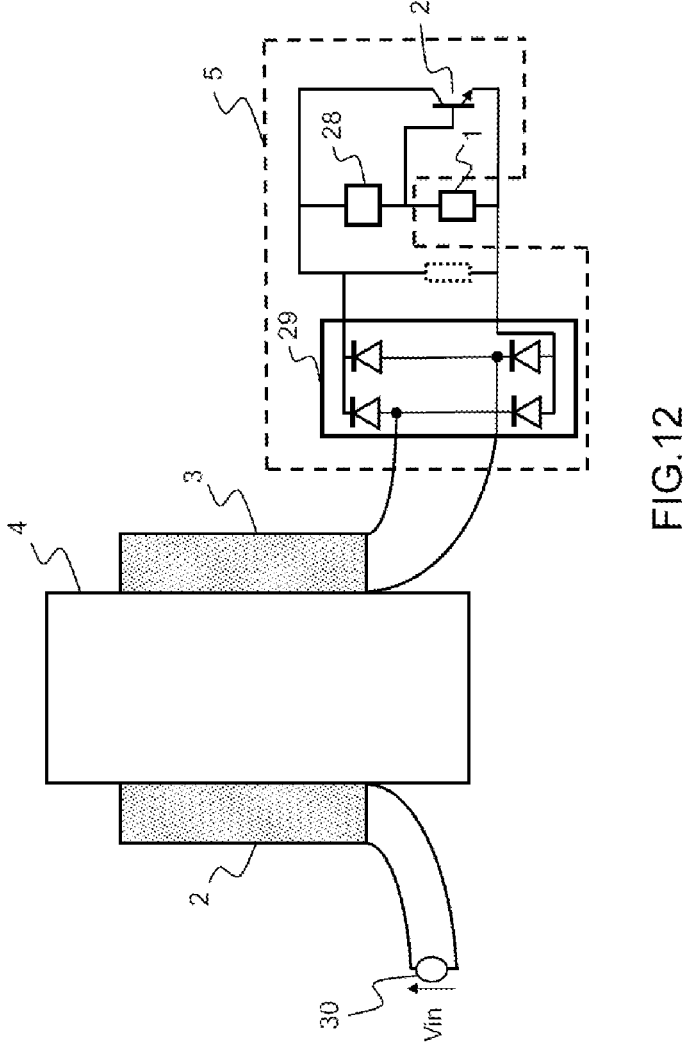

FIG. 12 illustrates another embodiment of the system according to the invention. The non-linear electrical circuit 5 comprises a rectifier bridge 29 connected to the terminals of the second electromechanical transducer 3, and a transistor 27 controlled by the voltage across the terminals of the sensor 1.

The sensor 1 is a temperature sensor linked to the evolution of the threshold voltage of the transistor 27 with temperature. The threshold voltage corresponds to the gate voltage, which forms the transition between the blocking behaviour of the transistor and the conducting behaviour thereof. According to one variant, the sensor 1 may be a resistive sensor.

The transistor 27 may be a bipolar transistor. The base of the transistor 27 is connected to the sensor 1 and to a resistor 28. The collector of the transistor 27 is connected to the resistor 28 and to the rectifier bridge 29. The emitter of the transistor 27 is connected to the sensor 1 and to the rectifier bridge 29. The diagram of FIG. 12 corresponds to an assembly with an NPN transistor 27. A person skilled in the art could adapt this assembly to a PNP transistor 27. However, the embodiment is not limited to bipolar transistors.

A first amplitude may be identified such that the diodes of the rectifier bridge 29 are turned on, this corresponding to two diode thresholds.

The second amplitude depends on the turn-on voltage of the transistor. This turn-on voltage depends for example on the junction temperature of the transistor (temperature sensor) or on the value of the variable resistor (resistive sensor). For example, the variable resistor of the sensor 1 influences the threshold voltage of the transistor 27. The information relating to the state of the sensor is therefore linked to the value of the threshold.

Via an increasing amplitude, a first impedance change is thus detected when the diodes of the rectifier bridge 29 become conducting, and then a second impedance change is detected when the transistor 27 becomes conducting. Measuring the difference between the second threshold and the first threshold makes it possible to deduce the value of the first sensor 1 or of the temperature therefrom.

The invention claimed is:

1. A method for determining the state of at least one sensor, said method using a first electromechanical transducer and a second electromechanical transducer that are mechanically coupled to a substrate, and an exclusively analogue non-linear electrical circuit electrically connected between the second electromechanical transducer and the sensor, the method comprising the steps of:

applying an electrical signal (Vin) at a first amplitude to the terminals of the first electromechanical transducer, and determining a first set of values (Mod1, Arg1) of a parameter characteristic of the electrical impedance of the first electromechanical transducer in response to the application of said electrical signal (Vin);

applying said electrical signal at a second amplitude to the terminals of the first electromechanical transducer, and determining a second set of values (Mod2, Arg2) of the parameter characteristic of the impedance;

measuring a difference between the first set of values (Mod1, Arg1) and the second set of values (Mod2, Arg2); and determining a state of the sensor on the basis of the difference between the first set of values (Mod1, Arg1) and the second set of values (Mod2, Arg2).

2. The method according to claim 1, wherein the sensor comprises a variable-value electronic component, the method comprising the steps of:

determining a first value (Mod1, Arg1) of a parameter characteristic of the electrical impedance of the first electromechanical transducer, at the first amplitude, determining a second value (Mod2, Arg2) of a parameter characteristic of the electrical impedance of the first electromechanical transducer, at the second amplitude, the first value and the second value being such that the difference is non-zero, applying the electrical signal at a third amplitude, the third amplitude being between the first amplitude and the second amplitude, and determining a third value (Mod1, Arg1) of a parameter characteristic of the electrical impedance of the first electromechanical transducer, at the third amplitude, and determining the variable value of the variable-value electronic component on the basis of the first value, of the second value and of the third value.

3. The method according to claim 1, wherein the measurement of a difference between the first set of values and the second set of values is performed within a predefined frequency range, and comprises, within the frequency range, a measurement of a frequency difference between the passages through a predefined impedance modulus value or through a predefined impedance argument value of the first set of values and of the second set of values.

4. The method according to claim 1, wherein the measurement of a difference between the first set of values and the second set of values is performed within a predefined frequency range, and comprises, within the frequency range, a measurement of a frequency difference between the extreme value of the first set of values and the extreme value of the second set of values.

5. The method according to claim 1, wherein the measurement of a difference between the first set of values and the second set of values is performed within a predefined frequency range, and comprises, within the frequency range, a measurement of the phase difference between the first set of values and the second set of values at frequencies corresponding to a predefined value or an extremum of the modulus of the first set of values and to a predefined value or an extremum of the modulus of the second set of values.

6. The method according to claim 1, wherein the measurement of a difference between the first set of values and the second set of values is performed within a predefined frequency range, and comprises, within the frequency range, a measurement of the difference in modulus between the first set of values and the second set of values at frequencies corresponding to a predefined value or a phase extremum of the first set of values and to a predefined value or a phase extremum of the second set of values.

7. A system for determining the state of at least one sensor, the system comprising a first electromechanical transducer and a second electromechanical transducer that are mechanically coupled to a substrate, and an exclusively analogue non-linear electrical circuit electrically connected between the second electromechanical transducer and the sensor, the system comprising a sensor state determination unit, the sensor state determination unit being configured to:

apply an electrical signal (Vin) at a first amplitude to the terminals of the first electromechanical transducer, and determine a first set of values (Mod1, Arg1) of a parameter characteristic of the electrical impedance of the first electromechanical transducer in response to the application of said electrical signal (Vin);

apply said electrical signal at a second amplitude to the terminals of the first electromechanical transducer, and determine a second set of values (Mod2, Arg2) of the parameter characteristic of the impedance;

measure a difference between the first set of values (Mod1, Arg1) and the second set of values (Mod2, Arg2); and determine a state of the sensor on the basis of the difference between the first set of values (Mod1, Arg1) and the second set of values (Mod2, Arg2).

8. The system according to claim 7, wherein the non-linear electrical circuit comprises two diodes in parallel and reverse-biased with respect to one another, the diodes being configured to be connected in parallel with the sensor.

9. The system according to claim 7, wherein the non-linear electrical circuit comprises two Zener diodes that are connected head-to-tail in series, the Zener diodes being configured to be connected in series with the sensor.

10. The system according to claim 7, wherein the non-linear electrical circuit comprises a first branch and a second branch that are connected in parallel, the first branch comprising two Zener diodes that are connected head-to-tail in series, the second branch comprising two diodes that are connected in parallel, reverse-biased with respect to one another and configured to be connected in series with the sensor.

11. The system according to claim 7, wherein the non-linear electrical circuit comprises a first current limiter and a second current limiter that are connected in series, the first current limiter moreover being configured to be connected in parallel with the sensor, the value of the short-circuit current of the first current limiter being less than the value of the short-circuit current of the second current limiter.

12. The system according to claim 7, wherein the non-linear electrical circuit comprises a first branch, a second branch and a third branch that are connected in parallel, the first branch comprising two Zener diodes that are connected head-to-tail in series, the second branch comprising two diodes that are connected in parallel and reverse-biased with respect to one another, and configured to be connected in series with a first sensor, the third branch comprising two Zener diodes that are connected head-to-tail in series, the Zener diodes of the third branch being configured to be connected in series with a second sensor.

13. The system according to claim 7, wherein the non-linear electrical circuit comprises a first branch and a second branch, the first branch comprising two diodes that are connected in parallel and reverse-biased with respect to one another, and configured to be connected in parallel with a first sensor, the second branch comprising two diodes that are connected in parallel and reverse-biased with respect to one another, the first and the second branch being configured to be connected in series with a second sensor.

14. The system according to claim 7, wherein the non-linear electrical circuit comprises a rectifier bridge connected to the terminals of the second electromechanical transducer, and a transistor controlled by the voltage across the terminals of the sensor, the sensor state determination unit being configured to determine a state of the sensor on the basis of the turn-on voltage of the transistor.

15. The system according to claim 7, wherein the first electromechanical transducer and the second electromechanical transducer each comprise a piezoelectric component.

* * * * *